United States Patent [19]

Eidschun

[11] 4,376,684

[45] Mar. 15, 1983

[54] SHIELDED PLATING CELL AND METHOD

[75] Inventor: Charles D. Eidschun, Clearwater, Fla.

[73] Assignee: Micro-Plate, Inc., Clearwater, Fla.

[21] Appl. No.: 295,714

[22] Filed: Aug. 24, 1981

[51] Int. Cl.³ .................... C25D 5/02; C25D 5/08
[52] U.S. Cl. ................................. 204/15; 204/224 R
[58] Field of Search ............................. 204/15, 224 R

[56] References Cited

U.S. PATENT DOCUMENTS

| | | | |
|---|---|---|---|
| 1,191,386 | 7/1916 | Battle | 204/206 |
| 4,036,705 | 7/1977 | Eidschun | 204/15 |
| 4,186,062 | 1/1980 | Eidschun | 204/224 R |

Primary Examiner—T. M. Tufariello
Attorney, Agent, or Firm—Jack E. Dominik

[57] ABSTRACT

Disclosed is a shielded plating cell which will permit continuous transfer of a printed circuit board by a single conveyor, whether chain-type, endless belt, or other unit is employed. The plating head and sparger assembly include a reverse flow chamber in which an anode is positioned thereby reversing the flow of the pressure fluid and creating a venturi effect in an area beneath a pair of shields which flexibly engage the printed circuit board and shield the upper portion as well as environment from the escape of spray. To assist in this shielding, an adjustable choke is provided so that the operator can manually balance the unit by shifting the choke to eliminate any pumping action which occurs in the delta formed at the ends of the printed circuit boards where the shields do not abruptly come together. Additionally, squeegee gates are provided at both ends of the cell to inhibit the migration of plating fluid outside the cell into related processing areas. The method is directed to the provision of those elements which permit balancing the choke to a point where pumping does not occur above the shields. In instances where fine adjustment can be made, the taping of the printed circuit board can be eliminated and the flexible shields serve the masking function as well.

5 Claims, 4 Drawing Figures

SHIELDED PLATING CELL AND METHOD

FIELD OF INVENTION

The present invention is directed to equipment useful in plating printed circuit boards and is related to that equipment shown in applicant's issued U.S. Pat. Nos. 4,036,705 and 4,186,062 generally found in U.S. Class 204, subclass 15 and subclass 224R.

SUMMARY OF THE ART

The art is essentially represented by applicant's issued U.S. Pat. No. 4,036,705 in which opposed rollers are employed to plate the tabs on a printed circuit board. The construction of U.S. Pat. No. 4,036,705 does not provide for continuous transfer by means of a single conveyor of the printed circuit boards, and therefore teaches essentially a batch process. While a masking film 21 is shown, the rollers do not involve any pressure fluid, and accordingly the masking film does not serve as a seal. Orientation is a function of a guide within the unit. Applicant's U.S. Pat. No. 4,186,062 discloses a unit in which the printed circuit board can be transferred longitudinally by means of a belt. It also discloses reverse flow and a venturi effect for providing solution concentrations on the tabs of the printed circuit board. A special masking belt is required in the apparatus of U.S. Pat. No. 4,186,062 and thus additional belts or transfer apparatus are required between various stations in the plating assembly. The equipment exemplefied by applicant's U.S. Pat. No. 4,186,062 while efficient and effective, may be costwise beyond the means of the smaller companies whose printed circuit board plating volume is less. In lower volumes, where the printed circuit boards are still taped for masking the line of demarkation on the plating of the tabs, a smaller machine but one with a single belt or conveyor for transfer through all processes is highly desirable.

SUMMARY

The present invention as to both apparatus and method is directed to a shielded plating cell which will permit continuous transfer of a printed circuit board by a single conveyor, whether chain-type, endless belt, or by other means. The plating head and sparger assembly include a reverse flow chamber in which an anode is positioned thereby reversing the flow of the pressure fluid and creating a venturi in an area beneath a pair of shields which flexibly engage the printed circuit board and shield the upper portion as well as environment from the escape of spray. To assist in this shielding, an adjustable choke is provided so that the operator can manually balance the unit by shifting the choke to eliminate any pumping action which occurs in the delta formed at the ends of the printed circuit boards where the shields do not abruptly come together. Additionally, squeegee gates are provided at both ends of the cell to inhibit the migration of plating fluid outside the cell into related processing areas. The method is directed to the provision of those elements which permit balancing the choke to a point where pumping does not occur above the shields. In instances where fine adjustment can be made, the taping of the printed circuit board can be eliminated and the shields serve the masking function as well.

In view of the foregoing it is a principal object of the present invention to provide an apparatus and method for continuously processing printed circuit boards transported by a single conveyor from station to station where other action such as secondary plating, rinsing, stripping, and the like will be conducted thereby eliminating manual transfer or transfer from one belt through an adjusting station to another belt.

Another object of the present invention is to provide a shielded plating cell and method which is controllable to maximize the amount of fluid agitation in the plating area commensurate with avoiding a pumping of the fluid through the delta or other gaps between the primary shield and the printed circuit board.

Yet another object of the present invention is to provide positive air flow and a secondary shield to further inhibit the migration of any fluids outside of the plating area.

A further and significant object of the present invention is to provide an apparatus and method in the form of a shielded plating cell which is less expensive to produce than related high speed equipment.

DESCRIPTION OF DRAWINGS

Further objects and advantages of the present invention will become apparent as the following description of an illustrative embodiment proceeds, taken in conjunction with the accompanying drawings, in which.

DESCRIPTION OF PREFERRED EMBODIMENT

Figure 1:
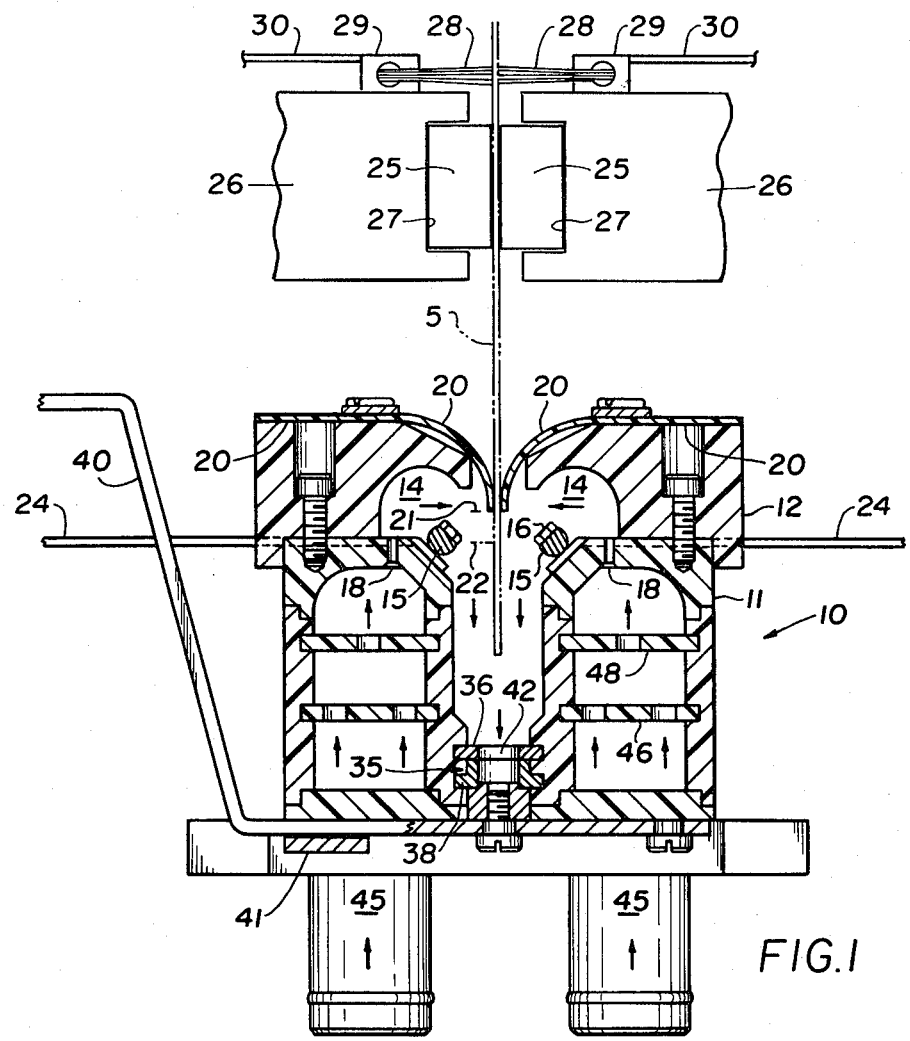
FIG. 1 is a transverse sectional view of the shielded plating cell taken essentially along section line 1—1 of FIG. 3.
Figure 4:
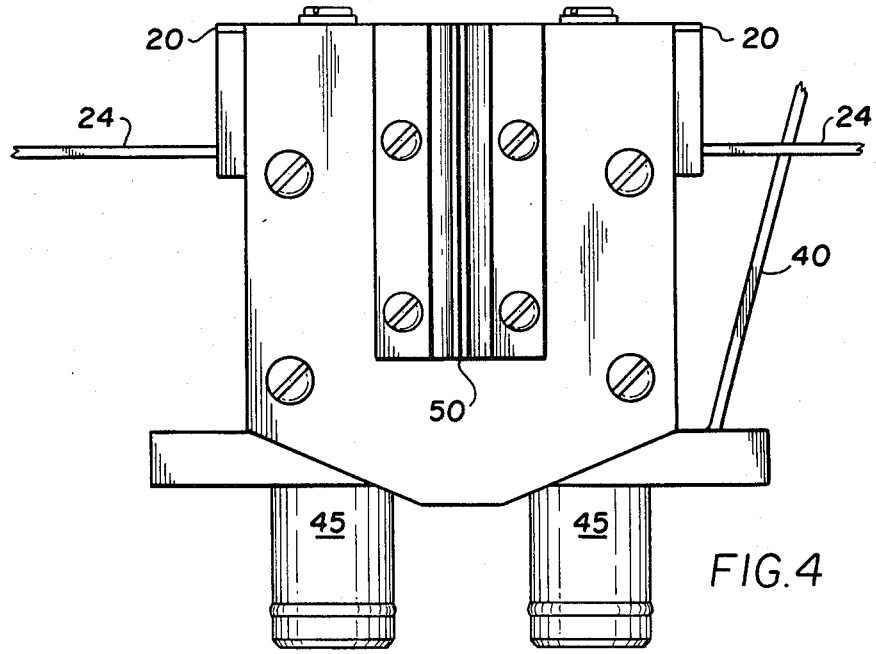
FIG. 4 is an end view of the subject plating cell.

As shown in the accompanying drawings, and more particularly in FIG. 1, a printed circuit board 5 is processed through a plating cell 10 which includes primarily a sparger assembly 11 and a flow guide 12. The flow guide 12 is provided with a reverse flow chamber 14 interiorly of which an anode 15 in the form of a bar is secured by means of a plurality of anode nuts 16 to the upper portion of the sparger assembly 11. The upper portion of the sparger assembly 11, on each side of the unit, has a discharge orifice 18 which directs fluid upwardly and which is thereafter reversed in the reverse flow chamber 14. To prevent the fluid from passing upwardly along the printed circuit board and elsewhere in the environment, a pair of opposed shields 20 in the form of a polypropylene sheet are secured to the upper portion of the flow guides 12 and depend downwardly to engage in a wiping sealing action against the printed circuit board. Also to be noted is that when the printed circuit board 5 is taped, there is a seal line of the tape 22 which is beneath the seal line 21 of the shield. As pointed out in the summary above, in many applications a printed circuit board which is not taped can be passed through the unit, and then the shield seal line 21 becomes the seal line for the plating action. The unit is provided with an anode contact strip 24 extending from both sides and providing the necessary current for electrodeposition.

The printed circuit board 5 is moved through the plating cell 10 by means of opposed transfer belts 25 shown diagrammatically at the upper portion of FIG. 1. The transfer belts 25 are held in opposed relationship by the belt guide 26 which has opposed belt tracks 27 for receiving and guiding the transfer belts 25. Electrical contact is made with the printed circuit board 5 by means of the conductive brushes 28 which are secured by a brush mount and cathode clamp 29 to the belt guide 26. Electrical communication is provided by means of the opposed cathode bosses 30 connected to the brush mount and cathode clamp 29. The plating cell 10 in many instances is shorter than the printed circuit board 5. As a result alignment of the printed circuit board 5 is accomplished by guides prior to entering the plating cell 10 and leaving the plating cell 10 which insures good alignment with the shield 20, assisted by means of the transfer belts 25 and their alignment through the belt guide 26.

It will be appreciated that the fluid which reverses in the reverse flow chamber 14 must drain from the unit, and it does downwardly on both sides of the printed circuit board and then passes through the choke assembly 35. The choke assembly 35 has an upper fixed choke bar 36, and a lower adjustable choke bar 38. Each of the bars is provided with a series of holes or drain ports 42 which can be positioned in complete register between the fixed choke bar 36 or adjustable choke bar 38, or moved by the choke lever 40 to adjust the adjustable choke bar 38 and thereby throttle the discharge. This action is undertaken manually by the operator, while observing the rate of flow, and particularly noting any pumping action in the delta area D (see FIG. 2) or up from the shields 20.

Specifically as to the sparger, it should be noted that there are a pair of lower sparger inlets 45 which feed fluid to the lower sparger baffle plate 46, and thereafter to the upper sparger baffle plate 48.

Figure 2:
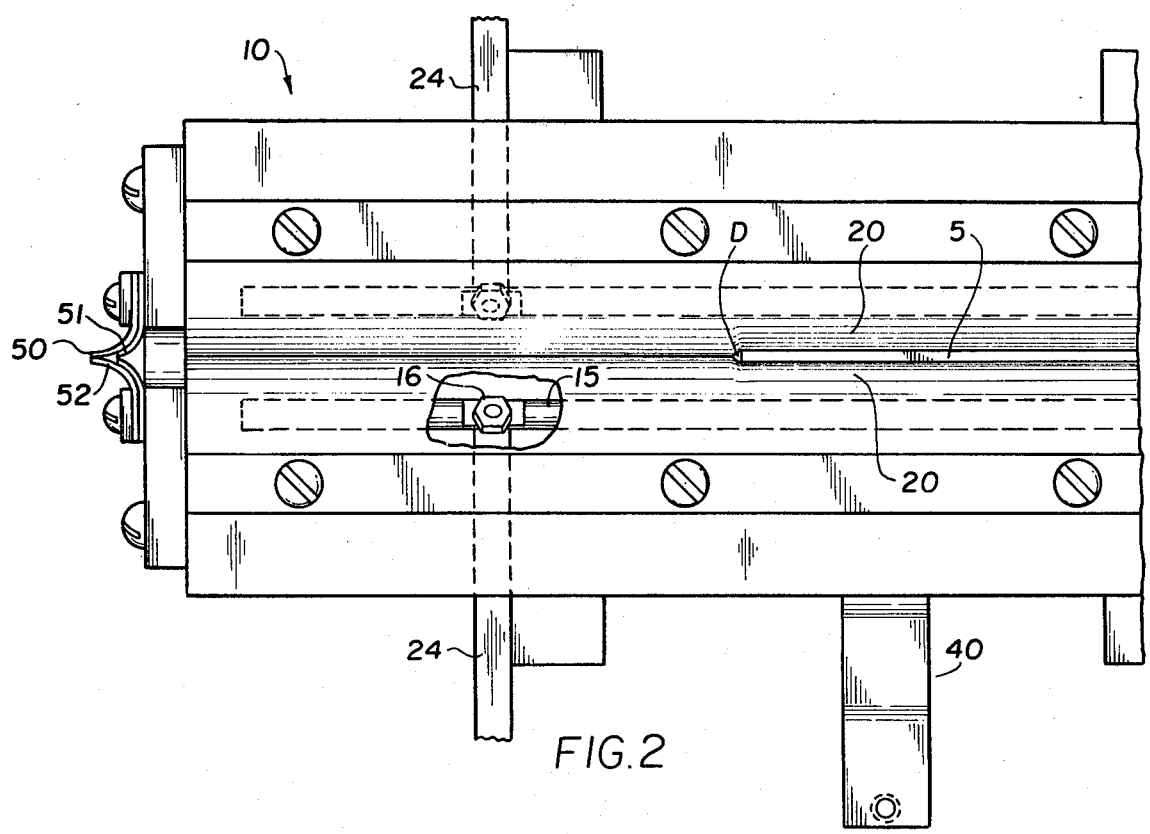
FIG. 2 is a top view of the subject plating cell.
Figure 3:
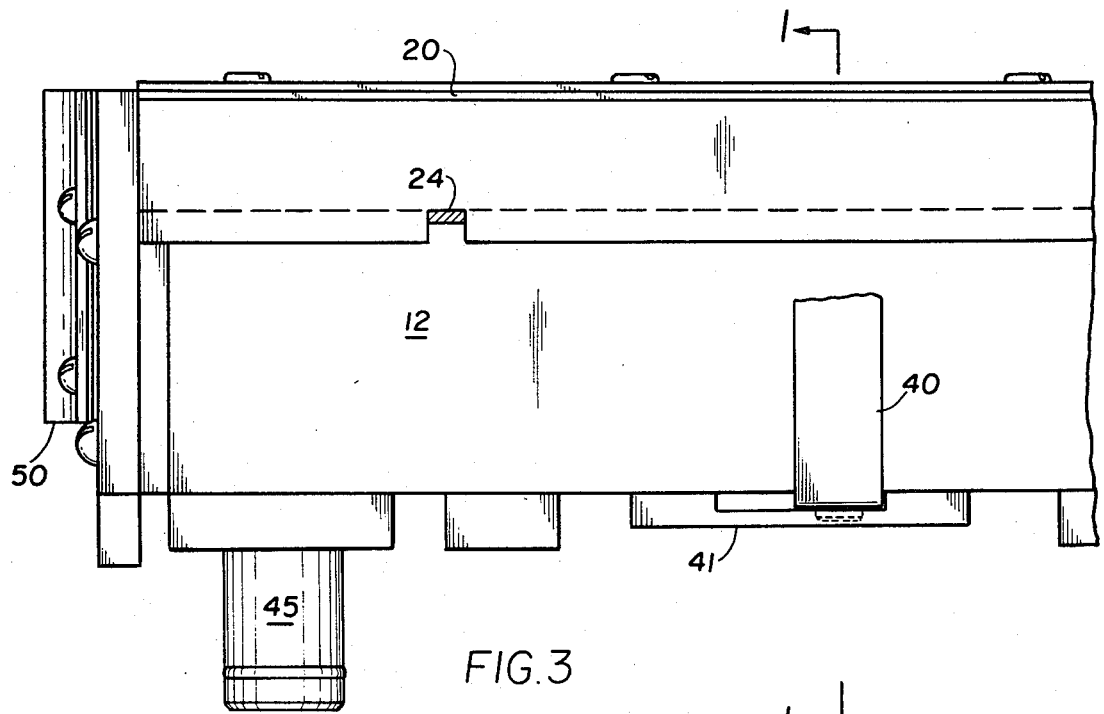
FIG. 3 is a front elevation of the subject plating cell.

To further shield the unit, particularly as will be noted in FIGS. 2 and 3, a squeegee gate assembly 50 is provided at each end of the unit to reduce if not eliminate the drag-out contamination of processes preceeding and following the action within the shielded plating cell itself. The squeegee gate assembly 50 contemplates an inner wiper 51 and an outer gate 52. The squeegee gates are preferably formed of Teflon, whereas the shields are desirably formed of natural polypropylene.

In practicing the method of the present invention provision is made to shield a printed circuit board at its front and rear portion while traversing a plating cell being transported in a longitudinal continuous fashion. The fluid flow is reversed in order to provide a venturi effect immediately beneath the shield, and the method further contemplates the adjustment of a choke for the discharge of fluid which can be balanced between minimum fluid contact, and too much fluid contact which will result in a pumping action of the shield or in the delta (D) formed at the ends of the printed circuit board.

Although particular embodiments of the invention have been shown and described in full here, there is no intention to thereby limit the invention to the details of such embodiments. On the contrary, the intention is to cover all modifications, alternatives, embodiments, usages and equivalents of the subject invention as fall within the spirit and scope of the invention, specification, and the appended claims.

I claim:

1. A shielded plating cell comprising, in combination, a flow guide,
a sparger assembly positioned beneath the flow guide,
means defining a reverse flow chamber at a lower portion of the flow guide and adjacent the sparger,
discharge means in the sparger for processing fluid into the reverse flow chamber to impinge upon a printed circuit board,
shields in the form of a flexible sheet-like member having a lower edge depending from the upper portion of the flow guide and in tangential pressure relationship with the printed circuit board,
means above and remote from the chamber for horizontal transport parallel to the lower edge of the shields,
and a manipulable choke assembly beneath the shields and contained printed circuit board whereby the discharge of spent fluid may be controlled and the venturi effect of the reverse flow chamber balanced to avoid the pumping of fluid up the shield or at the delta defined by the shield in the ends of the printed circuit board.

2. In the shielded plating cell of claim 1,
said choke assembly comprising a fixed choke bar,
an opposed adjustable choke bar,
ports in both choke bars for passing fluid when the same are in register,
and a choke lever permitting the operator to move the adjustable choke bar into and out of register with the fixed choke bar.

3. In the shielded plating cell of claim 1,
gate assemblies provided at the inlet and exit in the form of a squeegee.

4. The method of plating of printed circuit board in a shielded plating cell comprising, the steps of
providing for a reverse flow of plating fluid interiorly of the cell,
flexibly shielding the printed circuit board as it is moved along a conveyor spaced remote from the reverse flow plating fluid so that the fluid flow is inhibited from migrating up the printed circuit board and through the delta formed by the printed circuit board and the shielding means,
additionally providing for an adjustable choke for the fluid after the same has passed the printed circuit board,
adjusting the choke to maximize the fluid agitation in contact with the printed circuit board and balanching the same to avoid the pumping of the fluid through the seal and the delta area defined at the ends of the printed circuit board.

5. In the method of claim 4 above,
providing squeegee action at both ends of the shielded plating cell to inhibit the drag-out and ingress of the material employed in adjacent processing areas.

* * * * *